United States Patent [19]

Rogers

[11] Patent Number: 4,772,931
[45] Date of Patent: Sep. 20, 1988

[54] INTERDIGITATED SCHOTTKY BARRIER PHOTODETECTOR

[75] Inventor: Dennis L. Rogers, Croton-on-Hudson, N.Y.

[73] Assignee: IBM Corporation, Armonk, N.Y.

[21] Appl. No.: 883,187

[22] Filed: Jul. 8, 1986

[51] Int. Cl.$^4$ .................. H01L 27/14; H01L 29/48
[52] U.S. Cl. .......................... 357/30; 357/15; 357/16; 357/68
[58] Field of Search .............. 357/15, 15 P, 15 M, 357/16, 30 C, 30 E, 30 D, 30 F, 30 Q, 68

[56] References Cited

U.S. PATENT DOCUMENTS 3,700,980 10/1972 Belasco et al. .................. 357/30
4,478,879 10/1984 Baraona et al. .................. 427/85

FOREIGN PATENT DOCUMENTS 0063421 10/1982 European Pat. Off. .

OTHER PUBLICATIONS

IEEE Electron Device Letters, vol. EDL-5, No. 12, Dec. 1984, pp. 531–532 entitled "Monolithic Integration of a Metal–Semiconductor–Metal Photodiode and a GaAs Preamplifier" by M. Ito et al.
Japanese Journal of Applied Physics, vol. 19 (1980), supplement 19-1, pp. 459–464 entitled "Metal–Semiconductor–Metal Photodetector for High-Speed Optoelectronic Circuits" by T. Sugeta et al.
IEEE Transactions on Electron Devices, vol. ED-32, No. 6(1985) p. 1034, entitled "The Dsi-Diode—A Fast Large Area Optoelectronic Detector" by Roth et al.
Applied Physics Letters vol. 46, No. 10, 5/85, pp. 981–983 entitled "AlGaAs/GaAs p–i–n Photodiode/Preamplifier Monolithic Photoreceiver Integrated On a Semi-Insulating GaAs Substrate" by O. Wada et al. Electric Letters, vol. 22, No. 3, pp. 147–148, Jan. 30, 1986, "Monolithic GaAs Photoreceiver For High-Speed Signal Processing Applications" by W. S. Lee.

Primary Examiner—William L. Sikes
Assistant Examiner—Georgia Y. Epps
Attorney, Agent, or Firm—Perman & Green

[57] ABSTRACT

A semiconductor photodetector is formed of interdigitated, metal-semiconductor-metal electrodes disposed on a surface of semi-insulating semiconductor material, gallium arsenide. Radiation such as infra-red or visible light is converted to an electric current flowing between the electrodes upon application of a bias voltage between the electrodes. A Schottky barrier at the junction of each electrode surface and the semiconductor surface limits current flow to that produced by photons of sufficient frequency, or energy, to overcome the Schottky barrier. Tunneling of charge carriers of the current under the Schottky barrier, which tunneling results from the entrapment of charge carriers on the semiconductor surface, is inhibited by the production of a doped surface layer upon the foregoing surface between the electrodes to repulse the charge carriers and prevent their entrapment at the surface. The doped surface layer is much thinner than an interaction region of the radiation in the semiconductor material and has sufficiently high resistance to permit the photodetector to function efficiently.

9 Claims, 2 Drawing Sheets

INTERDIGITATED SCHOTTKY BARRIER PHOTODETECTOR

BACKGROUND OF THE INVENTION

This invention relates to semiconductor photodetectors having Schottky barriers at the electrodes thereof and, more particularly, to an interdigitated photodetector having a doped surface layer, thinner than a conversion region wherein incident photons are converted to charge carriers, for inhibiting the entrapment of charge carriers on the semiconductor surface, thereby to prevent tunneling for improved signal quality.

A semiconductor photodetector is responsive to incident radiation by a process of converting photons to electron-hole pairs within a layer of semiconductor material thicker than the radiation penetration depth. The resulting electrons and holes are drawn off as electric current between a pair of electrodes located on one or more surfaces of the semiconductor layer. In one form of a semiconductor photodetector of interest, the electrodes are formed as an interdigitated electrode structure, and are biased by an external source of voltage to draw off the electrons and the holes. The electrodes may be constructed of metal joined to the semiconductor material by either ohmic contacts or Schottky barrier contacts.

Of particular interest herein is the photodetector structure employing the Schottky barrier contacts.

The potential barrier of the Schottky construction is desirable for inhibiting the generation of electric current except by photon generated electron-hole pairs. This is useful in the transmission of digital signals optically by radiation such as infra-red and visible light, the optical signals being converted to electric signals by the photodetector. Such transmission may be accomplished by pulses of radiation. The Schottky construction is advantageous in that the foregoing action of the potential barrier inhibits the appearance of noise currents which would increase noise and distort the digital signals.

A problem arises in the foregoing structure wherein elements of the electrodes extend in parallel array across the surface of the semiconductor material. At the edges of the electrodes, intense potential gradients are present which can cause tunneling. The electron and the hole currents induced by the radiation can be entrapped at the surface of the semiconductor material. The entrapped charge carriers alter the profile of the potential fields at the sites of the Schottky barriers to increase the potential gradient even more, narrowing the potential barriers in a direction parallel to the semiconductor surface. In accordance with quantum mechanics, the tunneling of charges through the barriers increases, an effect of the tunneling being the appearance of noise currents in the reception of the foregoing digital signals. The tunneling, therefore, diminishes the advantage of using the Schottky construction in the photodetector.

One aspect of the entrapment of the charge carriers is the fact that the effect of the entrapped carriers, namely, the alteration of the potential field, changes slowly with time. For example, a pulsed infrared signal incident upon the detector would be converted by the altered potential field to a pulse having a relatively sharp leading edge followed by a slow drift in amplitude. The drift is a result of the slow variation in the disturbance of the potential field by the entrapped charge carriers. This effect may be characterized as an undesirable low frequency gain which alters the waveform of an incoming pulse signal train causing intersymbol interference. Further effects are large dark currents and diminished responsivity of the photodetector and its external circuits to incoming radiation signals.

SUMMARY OF THE INVENTION

The foregoing problem is overcome and other advantages are provided by a semiconductor photodetector comprising a layer of semiconducting material for converting radiation incident upon the photodetector into electric charge carriers within the layer. The invention is particularly applicable to semiconductor material formed of compounds of elements of the third and fifth columns of the periodic table, known as III-V compounds, such as gallium arsenide. In a preferred embodiment of the invention, the layer is composed of semi-insulating gallium arsenide.

The photodetector further comprises a first electrode having an electrically conductive element extending upon a surface of the layer, and a second electrode having an electrically conductive element extending upon the surface of the layer alongside of the element of the first electrode and spaced apart therefrom. Each electrode may have a plurality of elements in which case the electrodes are arranged in an interdigitated format. Each of the electrode elements forms a Schottky barrier with the semiconductor layer for development of an electric current in the presence of the incident radiation and upon connection of a source of bias voltage between the first and the second electrodes.

In accordance with the invention, the entrapment of charge carriers at the surface of the semiconductor layer under the influence of the electric fields in the vicinity of each of the electrode elements is inhibited by the construction of a doped semiconductor layer at the surface of the layer in which the conversion takes place between the photons and the electric charge carriers. The doped layer deflects and repulses charge carriers away from the surface, thereby to reduce entrapment of charge carriers along the surface and inhibit tunneling of charge carriers under a Schottky barrier. The doped layer is much thinner than the penetration depth of radiation into the conversion layer so as to permit efficient repulsion of charge carriers from the surface. The concentration of impurity atoms in the thickness of the doped layer is chosen such that the doped layer remains depleted of charge carriers and in a high resistivity state. In most cases this is achieved by limiting the product of the doping density and the square of the layer thickness, in accordance with the following equation, such that $$N_d d^2 \lesssim \epsilon E_g / 2q$$

where $N_d$ is the density of the dopant atoms; d is the depth or thickness of the layer; $\epsilon$ is the dielectric constant of the semiconductor; $E_g$ is the bandgap energy of the semiconductor; and q is the electron charge.

BRIEF DESCRIPTION OF THE DRAWING

The foregoing aspects and other features of the invention are explained in the following description, taken in connection with the accompanying drawing wherein.

DETAILED DESCRIPTION

Figure 1:
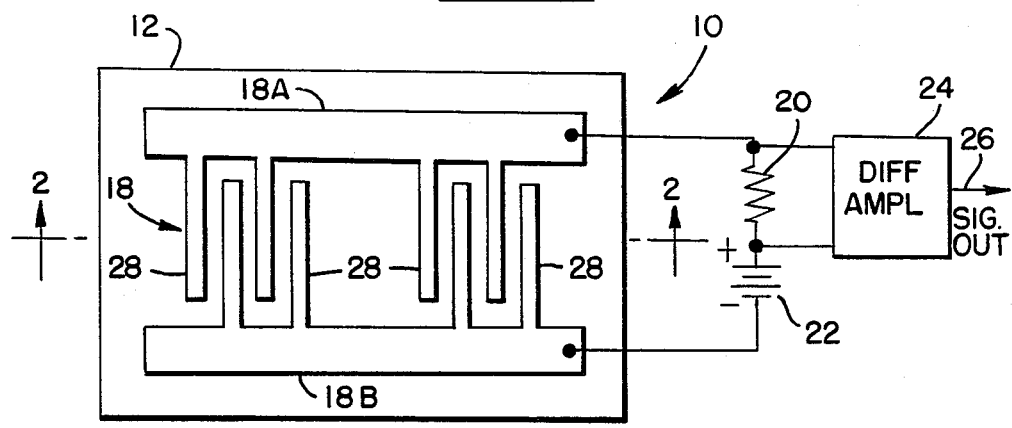
FIG. 1 is a plan view of a photodetector constructed in accordance with the invention, the view also showing connection of the photodetector with an external electric circuit.
Figure 2:
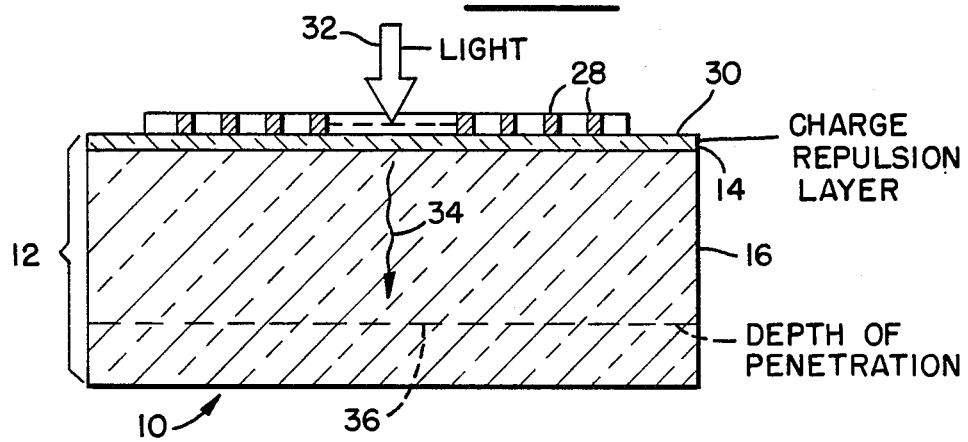
FIG. 2 is a sectional view of the photodetector of FIG. 1 taken along the line 2—2.

With reference to FIGS. 1 and 2, there is shown a photodetector 10 formed of a block 12 of semiconductor material, the block 12 being divided into two layers, namely, an upper layer 14 and a lower layer 16. A set of interdigitated electrodes 18 is disposed on top of the upper layer 14, the electrodes 18 including an anode electrode 18A connected via a resistor 20 to an anode terminal of a battery 22, and a cathode electrode 18B connected to a cathode terminal of the battery 22. The battery 22 serves as a source of voltage bias for operation of the photodetector 10, the resistor 20 providing a voltage drop proportional to detector current flowing through the photodetector 10. A differential amplifier 24 has a pair of input terminal connected to opposed terminal of the resistor 20 for providing an output signal on line 26 proportional to the detector current.

In the preferred embodiment of the invention, as depicted in FIG. 1, each of the electrodes 18 is provided with a set of elements 28 which extend transversely across a top surface 30 of the block 12. The elements 28 are parallel to each other and are spaced apart from each other to form the interdigitated structure. The electrodes 18 are formed of a metal such as gold, aluminum or platinum, or of other electrically conducting material such as tungsten-silicide which can be made to form a Schottky contact with the semiconductor.

In the fabrication of the photodetector 10, the block 12 is first prepared, the block 12 comprising semi-insulating semiconductor material suitable for converting photons of radiation into electron-hole pairs. While, in the preferred embodiment of the invention, the block 12 is composed of gallium arsenide, it is to be understood that the invention applies also to other semiconductor material, particularly III-V compounds of elements such as aluminum, indium and antimony. The gallium arsenide of the preferred embodiment is responsive to radiation in the range of frequencies from the infrared to the far red portion of the visible spectrum. The incident radiation is indicated in FIG. 2 by large arrow 32 for incoming light, and a smaller arrow 34 representing light which has entered into the block 12 and has become attenuated therein. The light of arrow 34 is attenuated exponentially with distance into the block 12, and may be regarded, for practical considerations, as been fully attenuated at a penetration depth indicated by a dashed line 36. The penetration depth is approximately two to three times the reciprocal of the extinction coefficient in a mathematical representation of the attenuation of the light.

The construction of the photodetector 10 continues by doping the upper surface 30 of the block 12 to form the upper layer 14 of the bulk material. The rest of the material of the block 12, indicated as lower layer 16, remains as semi-insulating gallium arsenide. The formation of the upper layer 14 can be accomplished by chemical-vapor deposition of ionic implantation of suitable dopant material. Alternatively, if desired, the upper layer 14 can be formed by the process of epitaxial growth upon the lower layer 16. The dopants employed in the doping of the upper layer 14 may be either n-type or p-type dopant. A suitable n-type donor, used in a preferred embodiment of the invention, is silicon. Beryllium may be employed as a p-type acceptor dopant. Germanium can also be used as a dopant, the type of doping (n or p) depending on the method of doping.

With respect to the physical dimensions of the structure of the photodetector 10, it should be noted that the portrayal of the electrode elements 28 is exaggerated in the height thereof so as to facilitate illustration of the elements 28. A typical value of height (FIG. 2) of the elements 28 is 0.15 micron. A typical value of width of an element 28 is 1.0 micron. A typical value of spacing between edges of successive ones of the elements 28 is 2.0 microns. The upper layer 14 has a depth of 1000 angstroms, typically. The penetration depth indicated by the spacing between the top surface 30 and the line 36 is typically 2.0 microns in the case of infrared radiation incident upon gallium arsenide, this being the case depicted in FIG. 2.

The operation of the photodetector 10 can be explained with reference to the diagrams shown in FIGS. 3 and 4.

Figure 3:
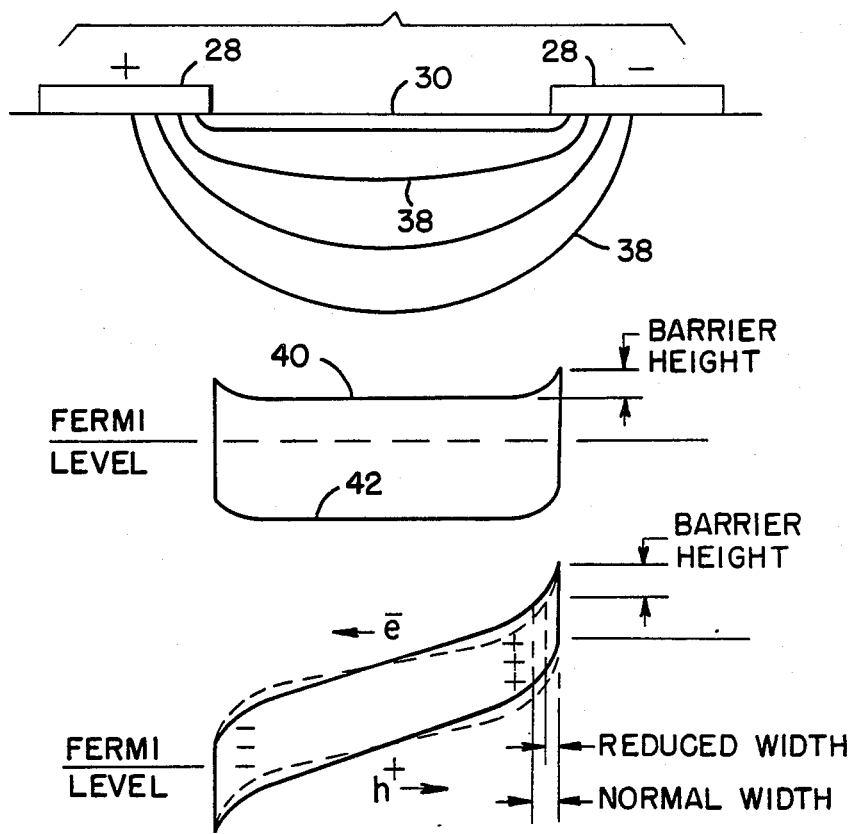
FIG. 3 shows electric field lines between two electrode elements of the photodetector, and energy level diagrams associated therewith.

In FIG. 3, the upper diagram shows two successive ones of the electrode elements 28 located on the surface 30, the view herein corresponding to that of the sectional view of FIG. 2. The upper diagram of FIG. 3 also shows lines 38 of force representing the electric field joining the elements 28 in response to the imposition of a bias voltage by the battery 22. In particular, it is noted that the lines 38 tend to cluster together near the edges of the elements 28, and to spread apart at further distance from the element 28. The clustering together of the lines 38 near the edges of the elements 28, in combination with the subsequent spreading of the lines 38 at distance from the elements 28, indicate a potential gradient and its associated high electric field strength in the vicinity of the edges of the elements 28. Such a field strength pattern, in the absence of the upper layer 14 of the invention, would induce a significant amount of entrapment of charge carriers of the electric current flowing between the electrode elements 28 in the presence of the incident radiation and upon imposition of the voltage of the battery 22. The entrapment of the charge carriers at the surface 30 rather than in the bulk of the material of the block 12 is particularly noticeable in the case of crystalline semiconductor material formed with high purity in which case there is little entrapment in the bulk material with the major portion of the entrapment occurring at the surface 30.

There is an energy band diagram corresponding to each of the lines 38 of force of the electric field. One such diagram is shown in the middle of FIG. 3, the diagram showing energy in the vertical direction and distance along a line 38 in the horizontal direction. By way of example, the energy level diagram in the middle of FIG. 3 is shown in registration with the inner edges of the elements 28 to correspond with the uppermost one of the lines 38, shown at the top of FIG. 3. This energy level diagram corresponds to the situation wherein the value of bias voltage is zero. Herein, the energy level diagram is symmetric with respect to each of the electrode elements 28. In particular, it is noted that there is a barrier having a height, as indicated in FIG. 3, this barrier being the potential barrier provided by a Schottky contact. In the construction of the photodetector 10, the electrodes 18 are formed on the surface 30 in accordance with well-known technology for forming a Schottky barrier between each of the elements 28 and the semiconductor material at the surface 30. Such construction corresponds to the energy diagram illustrated in the middle of FIG. 3. In particular, it is noted that the upper line 40 represents the bottom of a conduction band for electrons. The lower line 42 represents the upper edge of a valence band for holes. The Fermi level lies between the conduction and the valence bands.

The lower graph of FIG. 3 is the energy level diagram for the upper electric-field line 38 in the case wherein the battery 22 is applying a non-zero value of bias voltage. The electrode element 28 (top diagram) on the left side is understood to be provided with a positive potential relative to the electrode element 28 on the right side of FIG. 3, this being indicated by the plus and the minus signs. The bottom diagram of FIG. 3 is shown in two forms, one form being represented by a dashed line and the second form being represented by a solid line. The solid line indicates the energy level diagram which is present in the absence of entrapment of electric charge carriers at the surface 30, this being the energy level diagram present in the operation of the invention. The dashed line shows the effect on the energy level diagram produced by entrapment of the charge carriers, which effect would occur in the construction of a photodetector without implementation of the invention.

The solid trace shows a Schottky barrier with normal width, this width being sufficient to insure that no tunneling takes place. The dashed trace provides the Schottky barrier with a reduced width, which width allows a significant amount of tunneling to take place. Holes, indicated by the letter h and the plus signs migrate towards the right where the potential is more negative, and negative charges, indicated by the letter e and the minus signs, migrate towards the left where the potential is more positive. Trapped holes, indicated by the positive signs, are shown towards the right of the energy diagram while trapped electrons, indicated by the minus signs, are shown at the left side of the energy diagram. It is the set of trapped charges which alter the shape of the solid trace to provide the undesired dashed trace with its attendant reduced width. at the ends of the energy diagram.

The upper layer 14 (FIG. 2) is sufficiently doped to provide a repulsive force which deflects the charge carriers away from the surface 30 so as to inhibit the entrapment of the charge carriers. Thereby, the holes and the electrons do not collect at the ends of the energy diagram, and the dashed representation of the energy diagram does not appear. Thus, in accordance with the invention, the charge repulsion feature of the upper layer 14 insures that the energy diagram has the shape of the solid trace with its associated normal width to the Schottky barrier. As noted above, the normal width is sufficient to insure no more than an insignificant amount of tunneling through the barrier.

In a preferred embodiment of the invention, sufficient charge repulsion has been attained by doping the upper layer 14 with dopant at a concentration $10^{17}$ atoms/cubic centimeter. Such a concentration of dopant atoms in a layer on the order of a few microns thick, or thicker, would produce a highly conductive layer. However, in the relatively thin depth of the upper layer 14, 1000 angstroms or less as noted above, the conductivity of the upper layer 14 still remains relatively low, sufficiently low so as to present no significant contribution to the current flow between electrode elements 28. The concentration of charge carriers in the semi-insulating GaAs of the lower layer 16 is on the order of $10_8$ atoms/cubic centimeter, this being nine orders of magnitude less than that of the upper layer 14. The concentration of the dopant atoms is to be increased for thinner values of the upper layer 14, and is to be decreased for thicker values of the upper layer 14, the concentration being inversely proportional to the square of the layer of thickness as is disclosed above in the mathematical equation.

Figure 4:
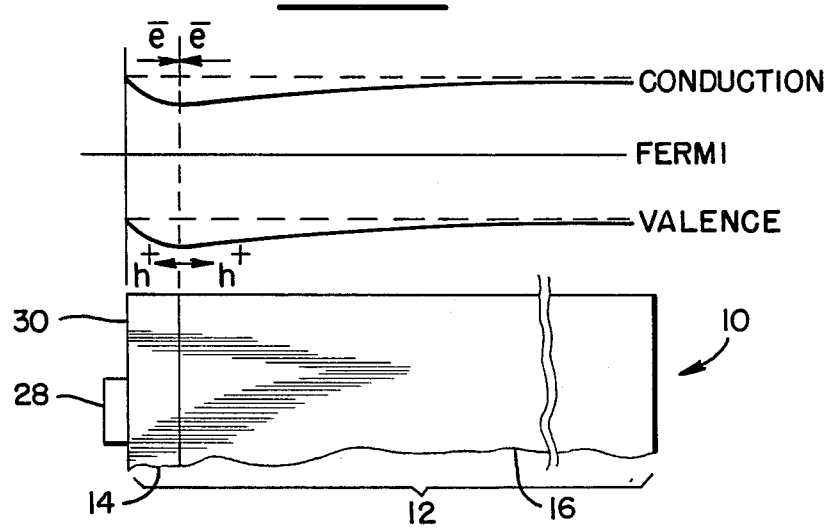
FIG. 4 shows an energy level diagram as a function of depth through the photodetector to illustrate operation of a charge repulsion layer of the photodetector.

The foregoing effect may be seen in FIG. 4 wherein the conduction and the valence bands are indicated by dashed lines for the case of an undoped upper layer 14, the solid trace showing the shift in energy level for the case of the doping of the upper layer 14. In FIG. 4, the graphs representing the conduction and the valence bands are drawn in registration with the layers 14 and 16 of the photodetector 10. The photodetector 10 is turned sideways in FIG. 4 in order to present the conduction and the valence bands as a function of distance normal to the surface 30 of the photodetector 10. The energy levels of FIG. 4 are drawn for the case of type-n doping wherein the upper layer 14 introduces a potential to the surface 30 which is more negative than the interface between the layers 14 and 16.

Thus, as shown in FIG. 4, at the interface between the layers 14 and 16, there is produced a potential well towards which the electrons migrate and from which the holes are expelled. Thereby, electrons tend to be driven away from the surface 30 so as to avoid entrapment of the electrons at the surface 30. Also, with respect to the holes, the great majority of the holes is urged into the lower layer 16 while only a relatively small fraction of the holes is driven toward the surface 30. This avoids entrapment of all but a small fraction of holes at the surface 30. The foregoing discussion of the energy levels of FIG. 4 applies also to the implementation of type-p doping in the upper layer 14.

It is interesting to note that, in the event that the upper layer 14 were extended to a greater depth, then the conduction band would approach the Fermi level as is the case in highly conductive material. However, due to the relatively small depth of the upper layer 14, the conduction band remains distant from the Fermi level, in spite of the high concentration of dopant atoms, so as to retain sufficient resistance between the anode electrode 18A and the cathode electrode 18B for proper operation of the photodetector 10. By way of example, in view of the high resistance of a layer of intrinsic, or semi-insulating, semiconductor material, as in the lower layer 16, which resistance might be on the order of many (10 to 40) megohm, a resistance of the upper layer 14 on the order of 0.1 megohm or 1.0 megohm would be adequate resistance for proper operation of the photodetector 10. This is attained with the above-noted depth of 1000 angstroms (0.1 micron) of the upper layer 14.

The foregoing discussion applies to a structure of the electrodes 18 containing any number of the electrode elements 28. The dashed lines appearing in FIG. 1 indicate that the electrode structure may be extended to insert as many electrode elements 28 as may be required. Also the number of electrode elements 28 may be reduced. In the limiting case of only two electrode elements 28, one for the anode electrode 18A and one for the cathode electrode 18B, the foregoing theory of operation still applies.

The structure of the photodetector 10 is readily constructed on a supporting substrate (not shown) which might also support other semiconductor devices in the form of an integrated circuit, such devices including a field-effect transistor such as a GaAs MESFET. For example, such transistors may be constructed of layers of semiconductor material with implantation of dopants in specific regions. The processes employed in the construction of such devices may also employed in the construction of the invention. In particular, it is noted that steps of implantation, such as ionic implantation, are followed by a step of annealing to refurbish the crystalline structure so as to seat the implanted atoms in their proper sites in the crystalline lattice. While such annealing may tend to increase the tendency for surface entrapment of charged carriers, the thin charge repulsion layer of the invention adequately inhibits such entrapment. Thus, the invention is compatible with the implant annealing step.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A semiconductor photodetector comprising:
   a layer of semiconducting material which converts radiation incident upon the photodetector into electric charge carriers;
   a first electrode having an electrically conductive element extending upon a surface of said layer;
   a second electrode having an electrically conductive element extending upon said surface of said layer alongside of said element of said first electrode and spaced apart therefrom;
   each of said electrode elements forming a Schottky barrier with said semiconductor layer for development of an electric current in the presence of the incident radiation and upon connection of a source of bias voltage between said first and said second electrodes, said photodetector further comprising:
   means located along said surface for deflecting charge carriers away from said surface, a deflection of charge carriers away from said surface serving to reduce entrapment of charge carriers of said electric current along said surface and inhibit tunneling of charge carriers under a Schottky barrier; and wherein
   said deflecting means comprises a second layer of semiconductor material formed within said first-mentioned layer of semiconductor material and located at said surface, said second layer extending between said first and said second electrodes, and said second layer being doped to provide charge carriers with a concentration greater by at least an order of magnitude than the concentration of charge carriers in said first-mentioned layer;
   in said first-mentioned layer, said radiation penetrates to a predetermined penetration depth from said surface defining an active region for said converting, said first-mentioned layer having a thickness greater than said penetration depth of said radiation; and
   the depth of said second layer is smaller by at least approximately an order of magnitude than the depth of said active region.

2. A photodetector according to claim 1 wherein said first electrode comprises a first plurality of electrically conductive elements, said first plurality of elements including said first-mentioned element of said first electrode; and wherein said second electrode comprises a second plurality of electrically conductive elements, said second plurality of elements including said first-mentioned element of said second electrode, said first plurality of elements being interleaved among said second plurality of elements and being spaced apart therefrom to form an interdigitated electrode structure.

3. A semiconductor photodetector comprising:
   a layer of semiconducting material which converts radiation incident upon the photodetector into electric charge carriers;
   a first electrode having an electrically conductive element extending upon a surface of said layer;
   a second electrode having an electrically conductive element extending upon said surface of said layer alongside of said element of said first electrode and spaced apart therefrom;
   each of said electrode elements forming a Schottky barrier with said semiconductor layer for development of an electric current in the presence of the incident radiation and upon connection of a source of bias voltage between said first and said second electrodes, said photodetector further comprising:
   means located along said surface for deflecting charge carriers away from said surface, a deflection of charge carriers away from said surface serving to reduce entrapment of charge carriers of said electric current along said surface and inhibit tunneling of charge carriers under a Schottky barrier; and wherein
   said deflecting means comprises a second layer of semiconductor material formed within said first-mentioned layer of semiconductor material and located at said surface, said second layer extending between said first and said second electrodes, and said second layer being doped to provide charge carriers with a concentration greater by at least an order of magnitude than the concentration of charge carriers in said first-mentioned layer;
   in said first-mentioned layer, said radiation penetrates to a predetermined penetration depth from said surface defining an active region for said converting, said first-mentioned layer having a thickness greater than said penetration depth of said radiation;
   the depth of said second layer is smaller by at least approximately an order of magnitude than the depth of said active region;
   the material of said first layer is semi-insulating semiconductor material, the resistance of the active region depending on the depth and resistivity of said active region, the doping of said second layer reducing the resistivity thereof to a value less than the resistivity of said first layer, the resistance of said second layer depending on the depth and resistivity of said second layer, the resistance of said second layer being less than the resistance of said first layer;
   said first layer has a concentration of dopant atoms of approximately 10 exp (8) dopant atoms per cubic centimeter; and said second layer has a concentration of dopant atoms selected in accordance with a depth of said second layer, the concentration of dopant atoms in said second layer varying in accordance with the reciprocal of the square of the depth of the second layer, the concentration being approximately 10 exp (17) atom per cubic centimeter for a depth of the second layer having a value of approximately 1000 angstroms.

4. A photodetector according to claim 3 wherein said first electrode comprises further electrically conductive elements, said element and said further elements of said first electrode constituting a first plurality of elements; and wherein said second electrode comprises further electrically conductive elements, said element and said further elements of said second electrode constituting a second plurality of elements, said first plurality of elements being interleaved among said second plurality of elements and being spaced apart therefrom to form an interdigitated electrode structure.

5. a photodetector according to claim 3 wherein each of said electrodes is formed of metal, wherein the semiconductor material of said first and said second layers is semi-insulating gallium-arsenide, and wherein said second layer is doped with silicon as a type n dopant.

6. A photodetector according to claim 3 wherein each of said electrodes is formed of metal, wherein the semiconductor material of said first and said second layers is semi-insulating gallium-arsenide, and wherein said second layer is doped with beryllium as a type p dopant.

7. In a radiation responsive device comprising a Schottky barrier rectifying metal contact disposed on a surface of a block semiconductor material, the improvement comprising a doped region in said block at said surface adjacent to said metal contact, said region being less than the depth of penetration of said radiation into said block, said block having a thickness greater than said depth of penetration of radiation, and said region having a doping level which retains depletion of the remaining portion of said semiconductor penetrated by said radiation, said region having a concentration of charge carriers which is greater than a concentration of charge carriers in a layer of said block contiguous said region; and wherein said region is provided with a concentration of dopant atoms selected in accordance with a depth of said region, the concentration of dopant atoms in said region varying as the reciprocal of the square of the depth of said region, the concentration of dopant atoms being approximately 10 exp (17) atoms per cubic centimeter for a depth of said region having a value of approximately 1000 angstroms; and the charge carrier concentration of said layer is approximately 10 exp (8) atoms per cubic centimeter, the depth of penetration of said radiation being approximately two microns.

8. A device according to claim 7 wherein said semiconductor material is a compound of elements from groups III and V of the periodic table of elements.

9. A device according to claim 7 wherein the resistance of said region is in a range of approximately 0.1–1.0 megohm, and the resistance of said layer is in a range of approximately 10–40 megohms, and said semiconductor material is gallium arsenide.

* * * * *